US008497740B2

(12) United States Patent
Onishi

(10) Patent No.: US 8,497,740 B2
(45) Date of Patent: Jul. 30, 2013

(54) REFERENCE SIGNAL OSCILLATOR

(75) Inventor: Naoki Onishi, Sayama (JP)

(73) Assignee: Nihon Dempa Kogyo Co., Ltd., Tokyo (JP)

( * ) Notice: Subject to any disclaimer, the term of this patent is extended or adjusted under 35 U.S.C. 154(b) by 100 days.

(21) Appl. No.: 13/065,187

(22) Filed: Mar. 16, 2011

(65) Prior Publication Data

US 2011/0241785 A1 Oct. 6, 2011

(30) Foreign Application Priority Data

Mar. 31, 2010 (JP) ................................ 2010-083564

(51) Int. Cl.
*H03K 3/03* (2006.01)

(52) U.S. Cl.
USPC ......... 331/46; 331/2; 331/11; 331/41; 331/55

(58) Field of Classification Search
USPC ........................ 331/2, 46, 41, 55, 57, 1 A, 11
See application file for complete search history.

(56) References Cited

U.S. PATENT DOCUMENTS

| | | | | |
|---|---|---|---|---|
| 4,443,116 A * | 4/1984 | Yoshida et al. | ............... | 368/202 |
| 2011/0032005 A1 | 2/2011 | Onishi | | |

FOREIGN PATENT DOCUMENTS

| | | |
|---|---|---|
| CN | 101997545 | 3/2011 |
| JP | 59-194519 | 11/1984 |
| JP | 63-036675 | 3/1988 |
| JP | 6-132814 | 5/1994 |
| JP | 8-056120 | 2/1996 |
| JP | 8-317564 | 11/1996 |
| JP | 10-290158 | 10/1998 |
| JP | 2004-172686 | 6/2004 |
| JP | 2005-043289 | 2/2005 |
| JP | 2006-033747 | 2/2006 |

* cited by examiner

*Primary Examiner* — Arnold Kinkead
(74) *Attorney, Agent, or Firm* — Jordan and Hamburg LLP

(57) ABSTRACT

A rubidium oscillator or a cesium oscillator is used as a high stability oscillator, and an OCXO being a metastable oscillator which is inferior in a long-term frequency stability compared with the above oscillators but has a high short-term frequency stability is used as a backup. There is prepared a table in which an elapsed time since an occurrence of an abnormality in the high stability oscillator and weighting (use ratio) of use of the both oscillators is corresponded, and by using this table, after the high stability oscillator recovers, an oscillation frequency of the metastable oscillator is used by 100% initially, but thereafter the weighting (use ratio) of use of the metastable oscillator is made smaller and the use ratio of the high stability oscillator is made larger in stages.

3 Claims, 7 Drawing Sheets

400

| ELAPSED TIME AFTER ABNORMALITY (SECOND) | weight B (RATIO) | weight A (RATIO) |
|---|---|---|
| LESS THAN 100 SECONDS | 100% | 0% |
| 100 | 90% | 10% |
| 150 | 50% | 50% |
| 200 | 30% | 70% |
| 300 | 10% | 90% |
| 500 | 5% | 95% |
| 1,000 | 1% | 99% |
| 2,000 | 0% | 100% |
| OVER 2,000 | 0% | 100% |

400

| ELAPSED TIME AFTER ABNORMALITY (SECOND) | weight B (RATIO) | weight A (RATIO) |
|---|---|---|
| LESS THAN 1200 SECONDS | 100% | 0% |
| 1,200 | 90% | 10% |
| 2,000 | 50% | 50% |
| 3,000 | 5% | 95% |
| 5,000 | 1% | 99% |
| 10,000 | 0% | 100% |
| OVER 10,000 | 0% | 100% |

REFERENCE SIGNAL OSCILLATOR

BACKGROUND OF THE INVENTION

1. Field of the Invention

The present invention relates to a reference signal oscillator which outputs a reference signal.

2. Description of the Related Art

In a base station of a radio communication system, a reference frequency signal having quite a high frequency stability is required, and thus an expensive oscillator such as a rubidium oscillator or a cesium oscillator is used. On the other hand, as a countermeasure against a trouble of the oscillator, there is adopted a redundant constitution in which duplexed oscillators as above are provided. Though a long-term frequency stability of such type of an oscillator is superior, it takes a long time since power application until a frequency becomes stable and its frequency stability for a short term is poor, and thus a backup oscillator is on standby in a state of power-on and being oscillating.

However, when the rubidium oscillator or the cesium oscillator is used as the backup, there is a problem that a price of the system becomes quite high.

Patent Document 1 describes a technique to include both TCXO and OCXO in a frequency synthesizer and to switchingly use the above as a reference signal, and Patent Document 2 describes a technique to include a voltage control digital temperature compensated oscillator and an OCCO and to switchingly use the above as a reference signal, but indication of the present invention is not given therein.

[Patent Document 1] Japanese Patent Application Laid-open No. Hei 8-56120

[Patent Document 2] Japanese Patent Application Laid-open No. 2004-172686

SUMMARY OF THE INVENTION

The present invention is made under such circumstances, and an object thereof is to provide a technique to enable a reference signal oscillator using a high stability oscillator with a superior long-term stability to output a reference signal continually and stably even when a short-time trouble occurs in the high stability oscillator, and also to enable an inexpensive price.

The present invention is an oscillator which includes:

a high stability oscillator;

a metastable oscillator which is inferior in a frequency stability of a long term compared with the high stability oscillator but is superior in a frequency stability of a short term shorter than the long term compared with the high stability oscillator and which constitutes a redundant configuration to the high stability oscillator;

a phase synchronization section synchronizing a phase of an output signal of the metastable oscillator with a phase of an output signal of the high stability oscillator while the metastable oscillator is on standby;

an abnormality detector detecting an abnormality of the high stability oscillator;

a frequency calculating section which performs a calculation of $A \cdot f1+(1-A) \cdot f2$ and outputs a calculation result as an output frequency of an oscillating device, when an output frequency of the high stability oscillator and an output frequency of the metastable oscillator are f1 and f2, respectively, and a ratio of weighting of the high stability oscillator is A ($0 \leqq A \leqq 1$);

and a weighting setting section which sets a correspondence between an elapsed time since a time point at which the abnormality of the high stability oscillator is detected by the abnormality detector and a value of the A, wherein the value of the A increases from 0 to 1 in stages along with the elapsed time.

An example is given as a concrete embodiment of the present invention.

It is configured to include: a first phase synchronization section synchronizing a phase of an output signal of the high stability oscillator with a phase of an output signal of the metastable oscillator; a second phase synchronization section synchronizing the phase of the output signal of the metastable oscillator with the phase of the output signal of the high stability oscillator while the metastable oscillator is on standby; and a control section which outputs a control signal to drive the metastable oscillator independently when the abnormality of the high stability oscillator is detected, and to once synchronize the phase of the output signal of the high stability oscillator with the phase of the output signal of the metastable oscillator and thereafter to drive the high stability oscillator independently, when the abnormality of the high stability oscillator is solved.

The high stability oscillator is a rubidium oscillator or a cesium oscillator, and the metastable oscillator is an oven controlled crystal oscillator.

The metastable oscillator includes a first metastable oscillator and a second metastable oscillator, wherein it is configured so that, when an abnormality occurs in the first metastable oscillator, the first metastable oscillator is switched to the second metastable oscillator in the metastable oscillator connected to the frequency calculating section.

In the present invention, in a reference signal oscillator using a high stability oscillator with a superior long-term stability, there is used a metastable oscillator which is inferior in a long-term frequency stability compared with the high stability oscillator but has a high short-term frequency stability as a backup. Switching to the high stability oscillator is not immediately after recovery of the high stability oscillator, but weighting (use ratio) of use of the metastable oscillator is made smaller in stages along with a lapse of time since an abnormality occurrence time of the high stability oscillator. Since the high stability oscillator is poor in a frequency stability immediately after power application while the metastable oscillator is superior in a frequency stability for a short term, by such weighting, a superior frequency stability can be expected.

DETAILED DESCRIPTION OF THE PREFERRED EMBODIMENT(S)

Figure 1:
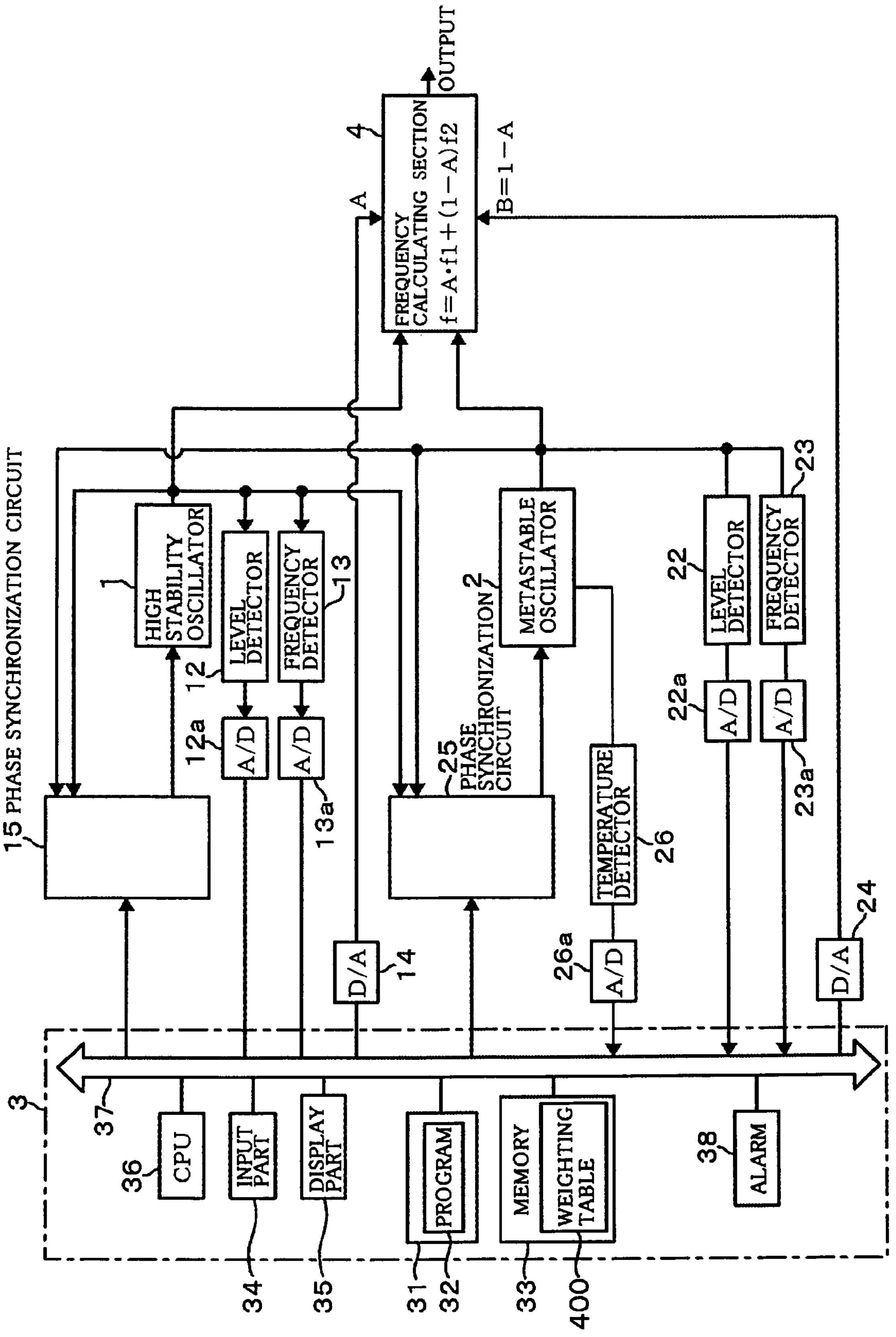
FIG. 1 is a block diagram showing a configuration of an embodiment of a reference signal oscillator of the present invention.

A reference signal oscillator shown in FIG. 1 includes a high stability oscillator 1 and a metastable oscillator 2. As the high stability oscillator 1, a rubidium oscillator, a cesium oscillator or the like, for example, is used, and as the metastable oscillator 2, an oven controlled crystal oscillator (hereinafter, referred to as an "OCXO"), for example, is used. As is already described above, the OCXO has a characteristic of being inferior in a frequency stability of a long term compared with the high stability oscillator 1 but being superior in a frequency stability of a short term shorter than the above-described long term. On the other hand, an oscillator has a poor frequency stability immediately after power application, and also in the high stability oscillator 1, a frequency stability is inferior to a frequency stability of the OCXO, during about a several minutes after power application, for example. It should be noted that a frequency stability immediately after power application in the high stability oscillator 1 varies in some degree depending on products even if the products are of the same model.

The high stability oscillator 1 is supplied with power from a power supply system of a base station, for example, while the metastable oscillator 2 is supplied with power from a standby power supply different from the power supply system of the base station, from a standby battery, for example.

A reference number 12 indicates a level detector which detects a level of a frequency signal outputted from the high stability oscillator 1 and a reference number 13 indicates a frequency detector which detects a frequency of the frequency signal, and detected values from these detectors 12, 13 are taken in to a control section 3 made of a computer, for example, via A/D (analog/digital) converters 12*a* and 13*a*, respectively. In a program 32 stored in a program storage part 31 of the control section 3, steps are configured so that a flow of FIG. 6 described later is executed. In a part of the steps of the program 32 it is judged whether or not the level detection value detected in the level detector 12 is within a set range and it is judged whether or not the frequency detection value detected in the frequency detector 13 is within a set range. Then, if at least one of the detection values is judged to be out of the set range, it is judged that an abnormality has occurred in the high stability oscillator 1. In this example, the level detector 12, the frequency detector 13, and the part of the judging step of the detection values in the program 31 are equivalent to an abnormality detector which detects an abnormality of the high stability oscillator 1.

In a subsequent stage of the respective oscillators 1, 2, there is provided a frequency calculating section 4 for weighting and calculating (mixing) output signals of the oscillators 1, 2. The frequency calculating section 4 has a function, when an output frequency of the high stability oscillator 1 and an output frequency of the metastable oscillator 2 are f1 and f2, respectively, and a ratio of weighting of the high stability oscillator 1 is A ($0 \leqq A \leqq 1$), to perform a calculation of $A \cdot f1 + (1-A) \cdot f2$ and to output a calculation result as an output frequency of the reference signal oscillator. It should be noted that the "ratio of weighting" is hereinafter referred to as a "weighting coefficient".

Figure 2:
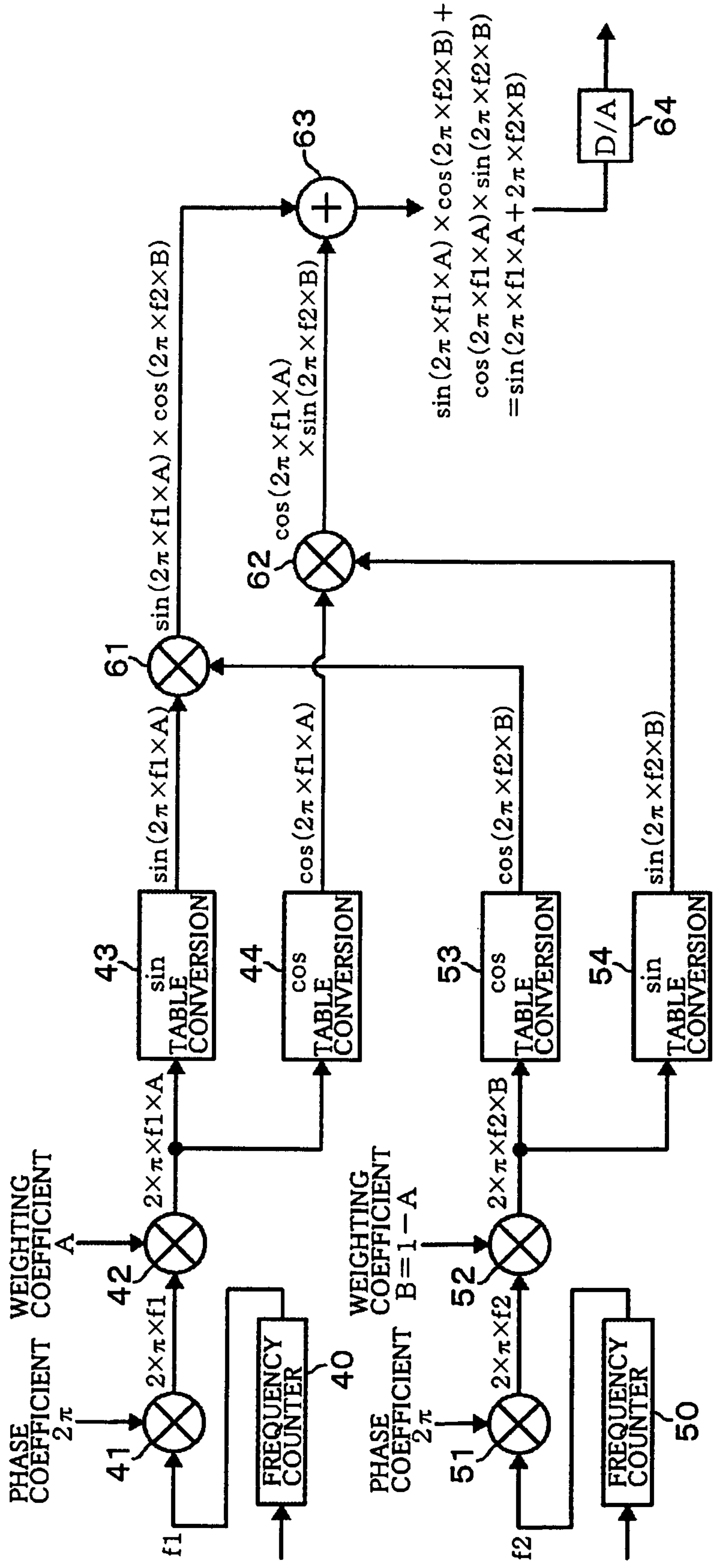
FIG. 2 is a configuration diagram showing a detail of a frequency calculating section used in the reference signal oscillator.

FIG. 2 is a configuration diagram showing an example of the frequency calculating section 4. The frequency of the frequency signal from the high stable oscillator 1 is counted by a frequency counter 40, and a count value f1 is multiplied by a phase coefficient 2π and a weighting coefficient A in sequence in multiplying parts 41, 42. Then, a value of $2\pi \cdot f1 \cdot A$ is converted into $\sin(2\pi \cdot f1 \cdot A)$ and $\cos(2\pi \cdot f1 \cdot A)$ by table converting parts 43, 44, respectively, being outputted as digital values. On the other hand, the frequency of the frequency signal from the metastable oscillator 2 is counted by a frequency counter 50, and a count value f2 is multiplied by a phase coefficient 2π and a weighting coefficient $B=(1-A)$ in sequence in multiplying parts 51, 52. Then, a value of $2\pi \cdot f2 \cdot B$ is converted into $\cos(2\pi \cdot f2 \cdot B)$ and $\sin(2\pi \cdot f2 \cdot B)$ by table converting parts 53, 54, respectively, being outputted as digital values. Then, $\sin(2\pi \cdot f1 \cdot A)$ and $\cos(2\pi \cdot f2 \cdot B)$ are multiplied in a multiplying part 61 and $\cos(2\pi \cdot f1 \cdot A)$ and $\sin(2\pi \cdot f2 \cdot B)$ are multiplied in a multiplying part 62. Subsequently, these multiplied values are added in an adding part 63, and as a consequence, $\sin(2\pi \cdot f1 \cdot A + 2\pi \cdot f2 \cdot B)$ is obtained. This digital value is D/A converted in a D/A converter 64. As described above, a frequency signal of a frequency made by weighting the output frequency of the high stability oscillator 1 by A and weighting the output frequency of the metastable oscillator 2 by B is outputted from the reference signal oscillator as a reference signal.

Figure 4:
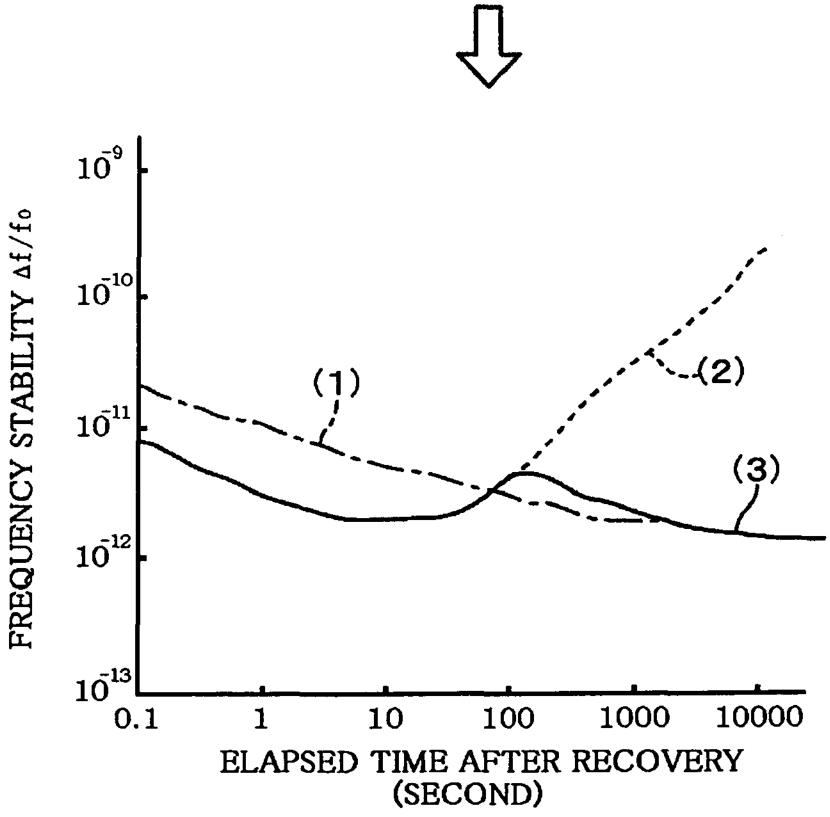
FIG. 4 is a characteristic chart showing an example of a stability of a frequency in a case when respective frequencies of the high stability oscillator and the metastable oscillator which are used in the reference signal oscillator are weighted and mixed.

The weighting coefficients A and $B=(1-A)$ are set in correspondence with an elapsed time after an abnormality of the high stability oscillator 1 is detected as indicated in an upper of FIG. 4, for example, and such a weighting table 400 is stored in a memory 33 of the control section 3. As is known from FIG. 4, in the weighting table 400, the weighting coefficient A is set to be 0% (weighting coefficient B is set to be 100%) for a while after a time point at which the abnormality of the high stability oscillator 1 is detected. This is based on that it is necessary to depend on the metastable oscillator 2 by 100% at first since the high stability oscillator 1 is abnormal. Then, when a predetermined time passes, when 100 seconds passes in an example of FIG. 4, weighting of the high stability oscillator 1 is heightened (weighting of the metastable oscillator 2 is lowered) in stages along with the elapsed time, and finally the weighting of the high stability oscillator 1 is made to be 100% and a signal of only the high stability oscillator 1 is used as a reference frequency signal. It should be noted that since a trouble of the high stability oscillator 1 is supposed to be in a short term, in an example of FIG. 4 an abnormal state is supposed to be solved within 100 seconds.

Figure 3:
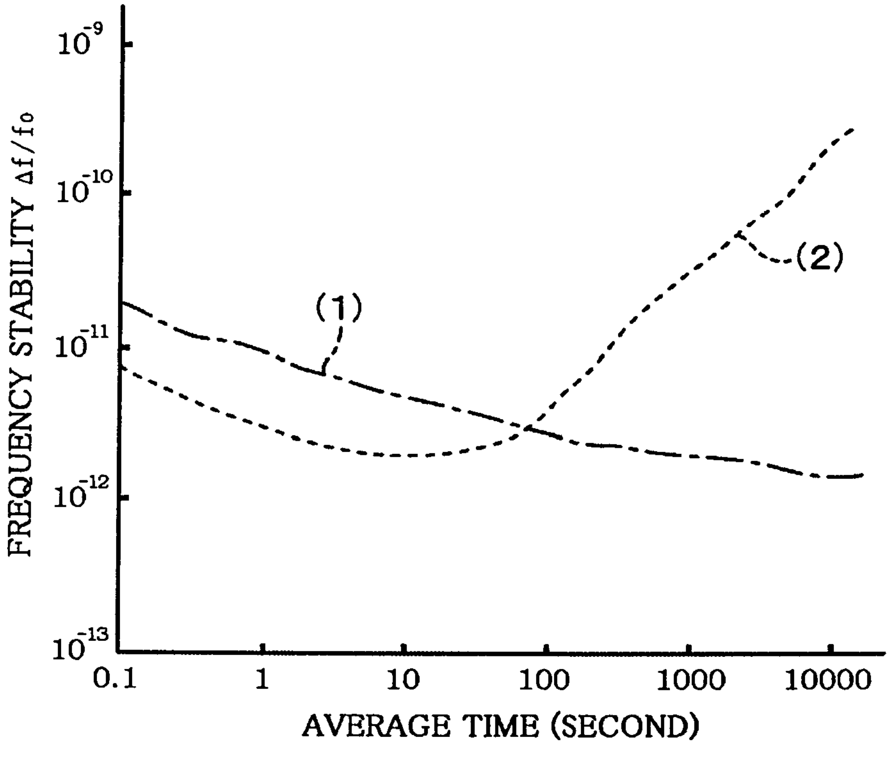
FIG. 3 is a characteristic chart showing frequency stabilities in a high stability oscillator and a metastable oscillator which are used in the reference signal oscillator.

Here, a relationship among the weighting table 400, the respective frequency stabilities of the high stability oscillator 1 and the metastable oscillator 2, and the output of the frequency calculating section 4 will be described. In FIG. 3, a vertical axis indicates a frequency stability and a horizontal axis indicates an average time. A meaning of the vertical axis of this graph is explained. A certain time (10 seconds, for example) is set and a an average value of a frequency obtained by sampling frequencies at a predetermined interval within this set time is represented by "f", a set frequency is represented by "$f_0$", and a difference between "f" and "$f_0$" is represented by "Δf", and $\Delta f/f_0$ is obtained. Then, by sequentially shifting a measuring start time of the set time, a moving average of $\Delta f/f_0$ is obtained, a value of which is a value of the vertical axis. Further, the horizontal axis indicates a value of the set time, which is shown as an average time. The graph of FIG. 3 can be said to be equivalent to Allan Variance which is a parameter showing a stability of an oscillator or an atomic clock, and the vertical axis is equivalent to σ (a square root of an average value of a square of a deviation).

A chain line (1) in FIG. 3 indicates a frequency stability of the high stability oscillator 1, while a broken line (2) in FIG. 3 indicates a frequency stability of the metastable oscillator 2. The characteristic chart of FIG. 3 is shown as only an example, and in reality, individual characteristics are different in some degree even of products of the same kind.

When weighting shown in the table 400 in the upper of FIG. 4 is performed to the characteristic in FIG. 3, a characteristic indicated by a solid line (3) in a lower of FIG. 4 is obtained. In this case, a time less than 100 seconds is estimated as a time for recovering of the high stability oscillator 1. In other words, a time since an occurrence of a trouble in the high stability oscillator 1 until recovery (solution of an abnormality) is estimated to be 99 seconds at the most. Since weighting of the metastable oscillator 2 is at 100% until an elapsed time exceeds 100 seconds, the frequency stability is dominated by the metastable oscillator 2. In other words, until the elapsed time exceeds 100 seconds, the high stability oscillator 1 is not used, and a frequency stability of less than 100 seconds not existing, a frequency stability of the reference signal oscillator is represented by the frequency stability of the metastable oscillator 2. Thereafter, since a weighting processing shown in the table 400 is performed, dominance by the high stability oscillator 1 gradually increases in the frequency stability, and then weighting of the high stability oscillator 1 comes to be 100%, the frequency stability being dominated by the high stability oscillator 1. The horizontal axis in FIG. 4 indicates the average time, and in evaluating the frequency stability, with the average time being regarded as an elapsed time since an abnormality detection time of the high stability oscillator 1, FIG. 4 can be taken as showing how the frequency stability changes.

Transitional characteristics of the frequency stabilities of the respective oscillators 1, 2 are mostly grasped, but in accurate, transitional characteristics are individually different, and besides, a time since the high stability oscillator 1 becomes abnormal until its recovery is estimated to be less than 100 seconds, but is not uniform for every abnormality time. Thus, based on the approximate transitional characteristics of the frequency stabilities of the respective oscillators 1, 2, weighting coefficients A and B are determined so as to evade a situation in which the frequency stability extremely worsens not only in a case when the high stability oscillator 1 recovers in 0.1 seconds but also in a case when the high stability oscillator 1 recovers at a time point close to 100 seconds (in a case when the frequency of the high stability oscillator 1 is used again at a time point soon after power is applied), and dominance is gradually moved from by the metastable oscillator 2 to by the high stability oscillator 1.

Figure 5:
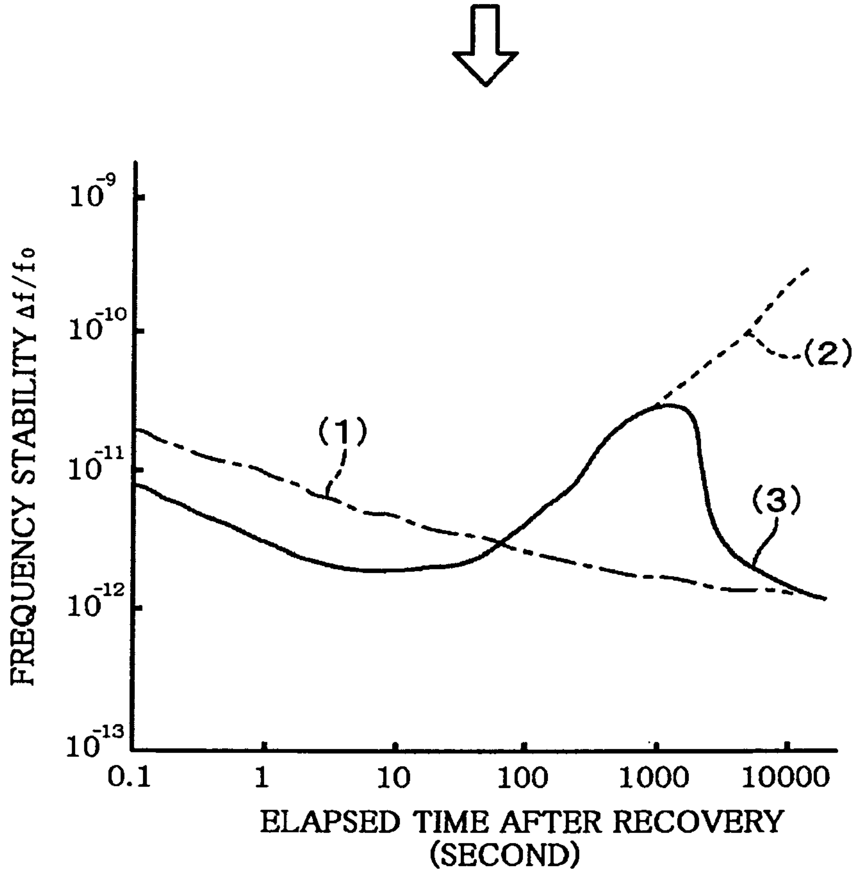
FIG. 5 is a characteristic chart showing another example of a stability of a frequency in a case when respective frequencies of the high stability oscillator and the metastable oscillator which are used in the reference signal oscillator are weighted and mixed.

Incidentally, if weighting shown in a table 400 of an upper of FIG. 5 is performed to the characteristic of FIG. 3, a characteristic indicated by a solid line (3) in a lower of FIG. 5 is obtained. This is a case of an example of a system in which a time point at which the high stability oscillator 1 recovers is estimated to be less than 1200 seconds (20 minutes) since an abnormality detection time. The weighting tables of FIG. 4 and FIG. 5 are examples, and in practice, an appropriate table is created after the frequency stabilities of the high stability oscillator 1 and the metastable oscillator 2 to be used are grasped.

Referring back to FIG. 1, the weighting table 400 is stored in the memory 33 as described above, and it is configured so that the table 400 is displayed in a display part 35 by an input part 34 and that values of an elapsed time after abnormality, a weighting coefficient A, a weighting coefficient B in the weighting table 400 can be freely set by the input part 34. Therefore, the weighting table 400 can be set to be the table shown in the upper of FIG. 4 or the table shown in the upper of FIG. 5, for example. The weighting coefficients A and B set in the weighting table 400 are read by the program 32 of the control section 3, and the read coefficients are transmitted to the frequency calculating section 4 via D/A converters 14, 24, respectively. In this example, the weighting table 400 and a part of the program 32 constitute a weighting setting section. It should be noted that in the control section 3 a reference number 36 indicates a CPU and a reference number 37 indicates a bus.

A phase synchronization circuit 15 is provided in relation to the high stability oscillator 1. The phase synchronization circuit 15 is for synchronizing an output of the high stability oscillator 1 with the frequency signal of the metastable oscillator 2 when the abnormality of the high stability oscillator 1 is solved. The time at which the abnormality is solved includes a case of recovery from an instantaneous electric power failure and also a case of recovery from temporary turn off of a power supply after an occurrence of a defect (an abnormality in the output level or the frequency) in the high stability oscillator 1. The high stability oscillator 1 is once synchronized with the metastable oscillator 2 by the phase synchronization circuit 15, but after several minutes, for example, the synchronization is cancelled and the high stability oscillator 1 is driven independently. Operations of synchronizing the output of the high stability oscillator 1 with the metastable oscillator 2 and of driving the high stability oscillator 1 independently thereafter are performed at a series of timings within a period during which weighting of the high stability oscillator 1 is 0%, for example.

Further, a phase synchronization circuit 25 is provided in relation to the metastable oscillator 2. The phase synchronization circuit 25 is for synchronizing the metastable oscillator 2 with the frequency signal of the metastable oscillator 2 while the metastable oscillator is on standby, and when the abnormality of the high stability oscillator 1 is detected, synchronization is cancelled and the metastable oscillator 2 is driven independently. Such a series of operations by the phase synchronization circuits 15, 25 is performed by a control signal generated in the control section 3 based on the program 32.

A reference number 22 indicates a level detector which detects a level of the frequency signal of the metastable oscillator 2, a reference number 23 indicates a frequency detector which detects a frequency of the frequency signal of the metastable oscillator 2, and a reference number 26 indicates a temperature detector which detects a temperature of a thermostatic oven of the OCXO being the metastable oscillator 2. Detection values of those detectors are taken in to the control section 3 via A/D converters 22*a*, 23*a*, 26*a*, respectively, and the control section 3 judges whether or not these detection values are within set ranges which has been set in advance, and if even one of these is out of the set range, the control section 3 judges that the metastable oscillator 2 is abnormal and outputs an alarm. Such judgment may be performed by a program in the control section 3, for example, or may be performed by hardware. In this embodiment, if an abnormality occurs in the metastable oscillator 2 when the high stability oscillator 1 is normal, the metastable oscillator 2 is exchanged or repaired.

Figure 6:
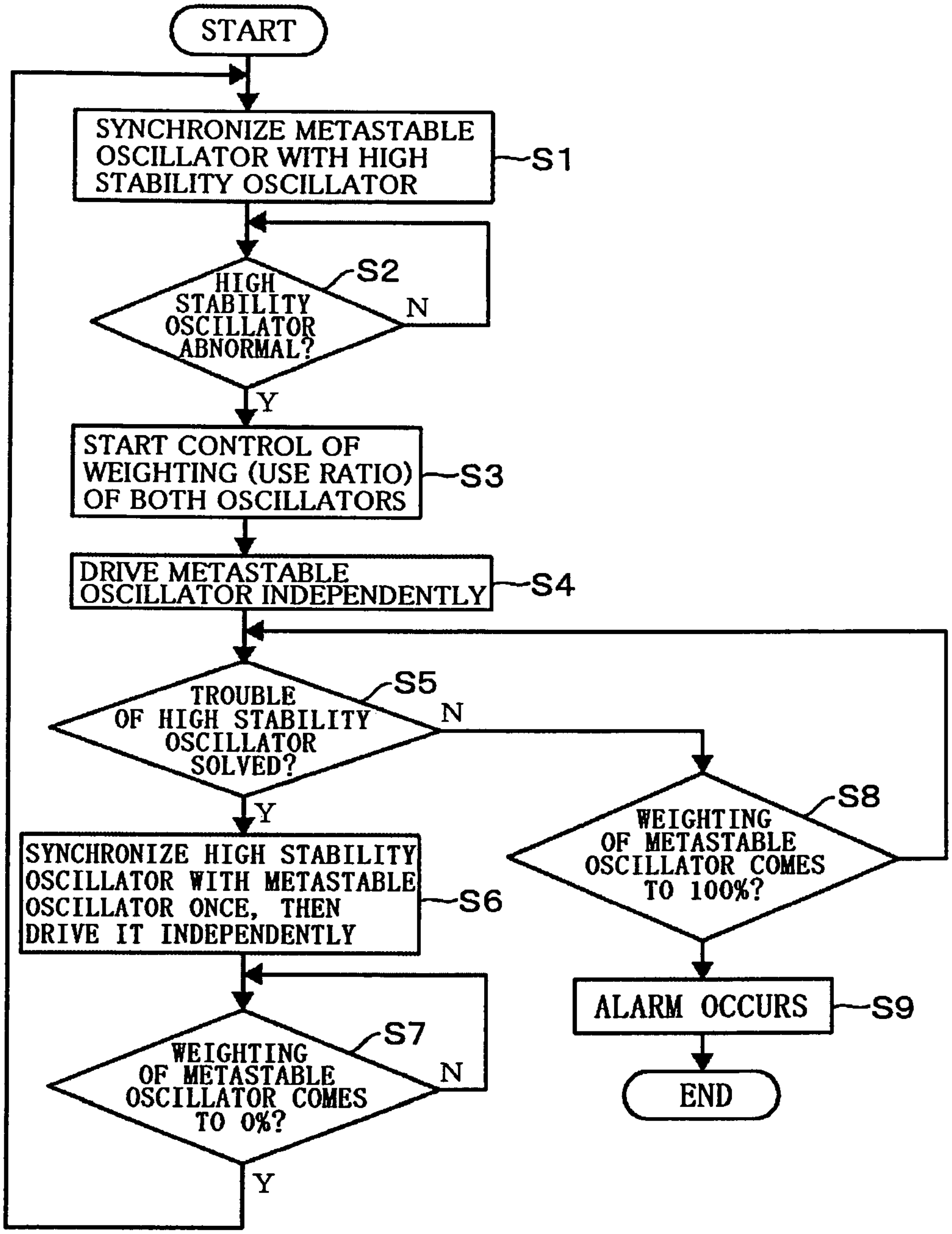
FIG. 6 is a flowchart showing an operational flow of an embodiment of the reference signal oscillator of the present invention.

Next, actions of the above-described embodiment are described. FIG. 6 shows an operational flow of the reference signal oscillator, in which the program 32 of the control section 3 outputs a control signal to the phase synchronization circuit 25 when the metastable oscillator 2 is on standby, thereby to synchronize the metastable oscillator 2 with the frequency signal of the high stability oscillator 1 (step S1). Besides, the program 32 of the control section 3 observes whether or not the high stability oscillator 1 is abnormal (step S2). This observation is performed based on respective detection values of the level detector 12 and the frequency detector 13. If at least one of these detection values is out of the set range, the program 32 of the control section 3 judges the high stability oscillator 1 as abnormal and starts control of weighting (step S3). The weighting control is control to set a timer since a time point when the high stability oscillator 1 is judged as abnormal, to read weighting coefficients A, B corresponding to an elapsed time of the timer with reference to the weighting table 400 in the memory 33, and to output to the frequency calculating section 4. Further, the program 32 of the control section 3 separates the metastable oscillator 2 from synchronization with the high stability oscillator 1, driving the metastable oscillator 2 independently (step S4).

As a result of starting control of weighting, the output frequency of the high stability oscillator 1 and the output frequency of the metastable oscillator 2 are mixed by weighting corresponding to the elapsed time and outputted as the reference frequency signal. First, the weighting coefficient B of the metastable oscillator 2 is initially 100%, and a superior short-term stability of the metastable oscillator 2 is utilized. On the other hand, the program 32 judges whether or not the high stability oscillator 1 recovers from the trouble (the abnormality is solved or not) (step S5), and if the high stability oscillator 1 has recovered, the program 32 once synchronizes the output of the high stability oscillator 1 with the frequency signal of the metastable oscillator 2, and thereafter, drives the high stability oscillator 1 independently.

Here, when the abnormality occurs in the high stability oscillator 1, in a case of an electric power failure, for example, the power supply is automatically applied when the electric power failure is solved, and in a case of the occurrence of the problem in the high stability oscillator 1, for example, the power supply is shut off by a not-shown switch section, for example, and the power supply is applied by the switch section when the problem is solved. Therefore, in both cases, the power supply is shut off when the abnormality occurs in the high stability oscillator 1, and the power supply is applied when the abnormality is solved.

The weighting coefficient B of the metastable oscillator 2 becomes smaller in stages (the weighting coefficient A of the high stability oscillator 1 becomes larger in stages), decreasing contribution of the short-term stability of the metastable oscillator 2 and increasing a degree of contribution of the long-term stability of the high stability oscillator 1. By doing as above, even if time points at which the high stability oscillator 1 recovers vary within an estimated range, strengths of the both oscillators are taken advantage of and a reference frequency signal which has a high frequency stability is generated. Then, the program 32 refers to the table 400 in correspondence with the elapsed time by the timer, judges whether or not the weighting coefficient B of the metastable oscillator 2 comes to be 0% (step S7), and when the weighting coefficient B comes to be 0%, the steps return to the step S1, where the output of the metastable oscillator 2 is synchronized with the frequency signal of the high stability oscillator 1.

On the other hand, when the high stability oscillator 1 does not recover from the trouble, in a step S8 it is judged whether or not the weighing of the metastable oscillator 2 comes to be lower than 100%, and if the weighting comes to be lower than 100%, that is, when the high stability oscillator 1 not recovering from the trouble is tried to be utilized, an alarm occurs (step S9). In other words, in this embodiment it is estimated that the high stability oscillator 1 recovers within 100 seconds, for example, and if the high stability oscillator 1 does not recover yet even when the weighting coefficient B of the metastable oscillator 2 comes to be lower than 100%, it is judged as a state of abnormality and an alarm 38 operates, and it is necessary to exchange or repair the high stability oscillator 1.

According to the above-described embodiment, there are used the high stability oscillator 1 having the superior long-term stability, and the metastable oscillator 2 being the OCXO whose short-term frequency stability is high though whose long-term frequency stability is inferior compared with the high stability oscillator as a backup. Switching to the high stability oscillator 1 is not immediately after recovery of the high stability oscillator 1, but weighting (use ratio) of use of the metastable oscillator 2 is made smaller in stages along with the lapse of the time since an abnormality occurrence time of the high stability oscillator 1.

Therefore, initially after switching to the metastable oscillator 2, superiority in the short-term stability of the frequency is utilized, and while a degree of such utilization is gradually decreased, a degree of utilization of superiority in the long-term stability of the frequency in the high stability oscillator 1 is increased. Therefore, an extreme instability of a frequency can be avoided at any timing within an estimated range of the recovery point (solution point) of the high stability oscillator 1, whereby, as a result, a system in which a frequency is stable can be constructed.

In this technique it is presumed that the abnormality of the high stability oscillator 1 is solved in a short term, but the time point of solution varies as well as the frequency stabilities of the high stability oscillator 1 and the metastable oscillator 2 vary in some degree, and thus by gradually decreasing the weighting of the metastable oscillator (gradually increasing the weighting of the high stability oscillator), the extreme instability of the frequency is evaded regardless of the timing of the time point of recovery (time point of solution), whereby, as a result, the system in which the frequency is stable can be constructed.

Figure 7:
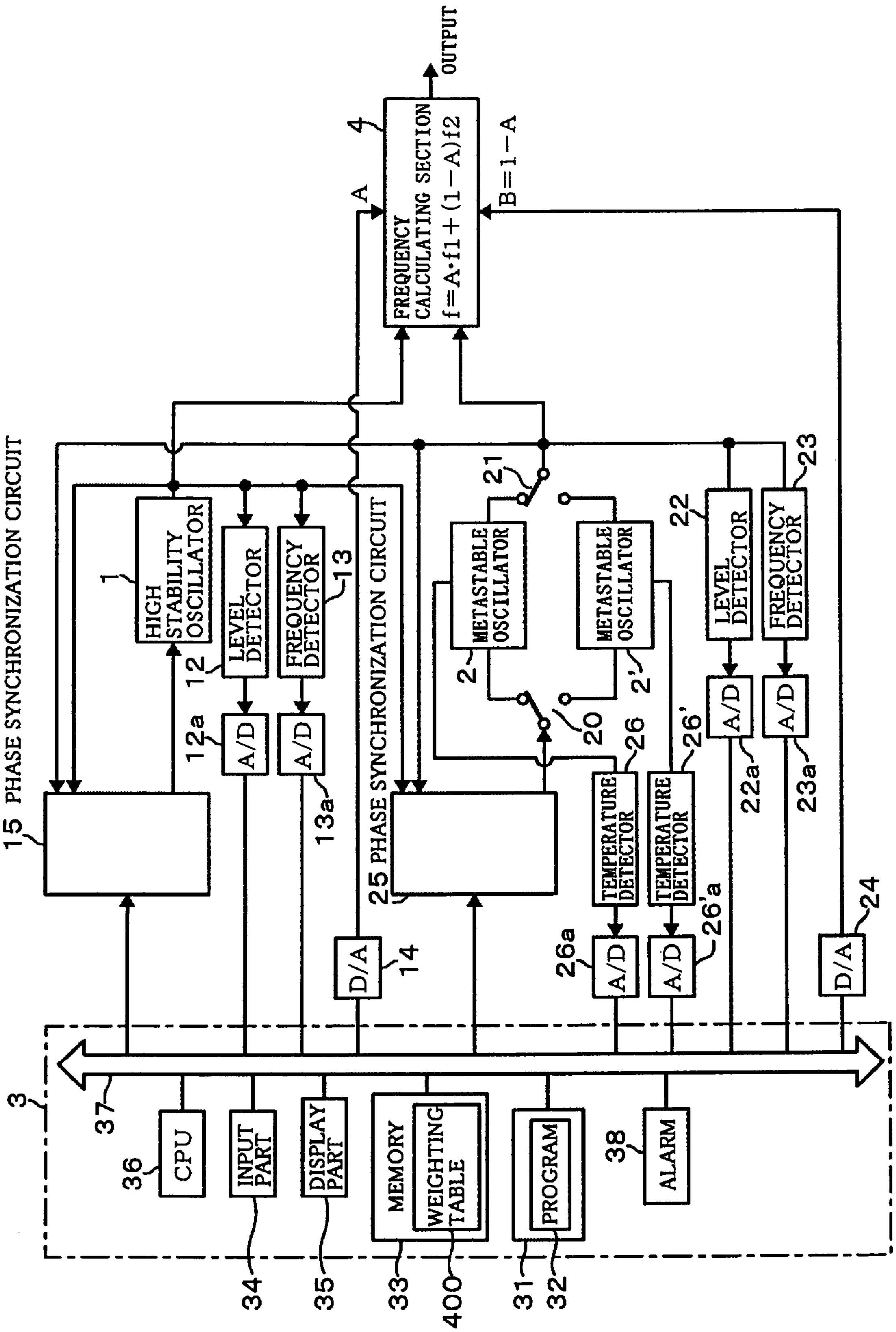
FIG. 7 is a block diagram showing a configuration of another embodiment of the reference signal oscillator of the present invention.

FIG. 7 is a diagram showing another embodiment of the present invention. Configurations of this embodiment different from the configuration of FIG. 1 are as follows.

a. Another metastable oscillator is added for redundancy, a supply path of a control voltage of the metastable oscillator outputted from a phase synchronization circuit 25 is branched via a switch section 20, and a first metastable oscillator 2 and a second metastable oscillator 2' are connected to respective branch paths.

b. A switch section 21 which is for selecting respective output terminals of the first metastable oscillator 2 and the second metastable oscillator 2' and which is synchronized with the switch section 20 is provided, and output signals of the first metastable oscillator 2 and the second metastable oscillator 2' are validated by switching of the switch section 21.

c. Also in the second metastable oscillator 2', power is supplied from a standby power supply, for example, similarly to in the first metastable oscillator 2.

d. Also in the second metastable oscillator 2', a temperature detector 26' which detects a temperature of a thermostatic oven is provided and a temperature detection value is inputted to a control section 3 via an A/D converter 26'*a*.

e. The switch section 20 is switched to a first metastable oscillator 2 side in advance and an operation similar to that in the above embodiment is performed. When an abnormality occurs in the first metastable oscillator 2, that is, when at least one of a level of a frequency signal, a frequency, and the temperature detection value is out of a set range, the switch sections 20 and 21 are switched to a second metastable oscillator 2' side by an instruction from the control section 3.

f. Also after switching from the first metastable oscillator 2 to the second metastable oscillator 2', control of weighting is performed with a weighting table having been set in the first metastable oscillator 2 being carried over as it is.

According to such an embodiment, even if an abnormality occurs in the first metastable oscillator 2, the second metastable oscillator 2' can be used, whereby a further reliable system can be constructed. In this case, if a not-shown phase synchronization circuit is further provided so that an output of the second metastable oscillator 2' is synchronized with a frequency signal of the first metastable oscillator 2 by the phase synchronization circuit when the first metastable oscillator 2 is selected (when the switch sections 20, 21 are switched), it is possible to switch to and use the second metastable oscillator 2' in a case when the abnormality occurs in the first metastable oscillator 2 in a state where weighting control begins due to an occurrence of an abnormality in the high stability oscillator 1, whereby the further reliable system can be constructed.

What is claimed is:

1. A reference signal oscillator comprising:

a high stability oscillator;

a metastable oscillator which is inferior in a frequency stability of a long term compared with said high stability oscillator but is superior in a frequency stability of a short term shorter than the long term compared with said high stability oscillator and which constitutes a redundant configuration to said high stability oscillator;

an abnormality detector detecting an abnormality of said high stability oscillator;

a frequency calculating section which performs a calculation of $A \cdot \mathbf{f1} + (1-A) \cdot \mathbf{f2}$ and outputs a calculation result as an output frequency of an oscillating device, when an output frequency of said high stability oscillator and an output frequency of said metastable oscillator are f1 and f2, respectively, and a ratio of weighting of said high stability oscillator is A ($0 \leqq A \leqq 1$);

a weighting setting section which sets a correspondence between an elapsed time since a time point at which the abnormality of said high stability oscillator is detected by said abnormality detector and a value of the A, wherein the value of the A increases from 0 to 1 in stages along with the elapsed time a first phase synchronization section synchronizing a phase of an output signal of said high stability oscillator with a phase of an output signal of said metastable oscillator;

a second phase synchronization section synchronizing the phase of the output signal of said metastable oscillator with the phase of the output signal of said high stability oscillator while said metastable oscillator is on standby; and a control section which outputs a control signal to drive said metastable oscillator independently when the abnormality of said high stability oscillator is detected, and to once synchronize the phase of the output signal of said high stability oscillator with the phase of the output signal of said metastable oscillator and thereafter drive said high stability oscillator independently when the abnormality of said high stability oscillator is solved.

2. The reference signal oscillator according to claim 1, wherein said high stability oscillator is a rubidium oscillator or a cesium oscillator, and the metastable oscillator is an oven controlled crystal oscillator.

3. A reference signal oscillator comprising:

a high stability oscillator;

a metastable oscillator which is inferior in a frequency stability of a long term compared with said high stability oscillator but is superior in a frequency stability of a short term shorter than the long term compared with said high stability oscillator and which constitutes a redundant configuration to said high stability oscillator;

an abnormality detector detecting an abnormality of said high stability oscillator;

a frequency calculating section which performs a calculation of $A \cdot \mathbf{f1} + (1-A) \cdot \mathbf{f2}$ and outputs a calculation result as an output frequency of an oscillating device, when an output frequency of said high stability oscillator and an output frequency of said metastable oscillator are fl and f2, respectively, and a ratio of weighting of said high stability oscillator is A ($0 < A < 1$);

a weighting setting section which sets a correspondence between an elapsed time since a time point at which the abnormality of said high stability oscillator is detected by said abnormality detector and a value of the A, wherein the value of the A increases from 0 to 1 in stages along with the elapsed time;

wherein said metastable oscillator includes a first metastable oscillator and a second metastable oscillator, and wherein it is configured so that, when an abnormality occurs in the first metastable oscillator, the first metastable oscillator is switched to the second metastable oscillator in said metastable oscillator connected to said frequency calculating section.

* * * * *